(12) United States Patent
Hur et al.

(10) Patent No.: US 10,672,719 B2
(45) Date of Patent: Jun. 2, 2020

(54) FAN-OUT SEMICONDUCTOR PACKAGE

(71) Applicant: SAMSUNG ELECTRONICS CO., LTD., Suwon-si (KR)

(72) Inventors: Kang Heon Hur, Suwon-si (KR); Jong Man Kim, Suwon-si (KR); Kyung Ho Lee, Suwon-si (KR); Han Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 15/923,708

(22) Filed: Mar. 16, 2018

(65) Prior Publication Data

US 2019/0096824 A1 Mar. 28, 2019

(30) Foreign Application Priority Data

Sep. 27, 2017 (KR) .......................... 10-2017-0125284

(51) Int. Cl.
*H01L 23/373* (2006.01)
*H01L 23/498* (2006.01)
(Continued)

(52) U.S. Cl.
CPC .......... *H01L 23/562* (2013.01); *H01L 21/486* (2013.01); *H01L 21/4857* (2013.01);
(Continued)

(58) Field of Classification Search
CPC ....... H01L 2224/02379; H01L 23/3672; H01L 23/3733; H01L 23/28–3192; H01L 23/023–024; H01L 23/24; H01L 23/36; H01L 23/373; H01L 23/3735; H01L 23/3736

See application file for complete search history.

(56) References Cited

U.S. PATENT DOCUMENTS 8,546,183 B2 10/2013 Huang et al.
8,848,380 B2 * 9/2014 Malatkar ................ H01L 25/16
361/746

(Continued)

FOREIGN PATENT DOCUMENTS

KR 10-2014-0026570 A 3/2014
KR 10-2016-0132751 A 11/2016
(Continued)

OTHER PUBLICATIONS

Office Action issued in corresponding Korean Patent Application No. 10-2017-0125284 dated Oct. 10, 2018.
(Continued)

*Primary Examiner* — Jose R Diaz
(74) *Attorney, Agent, or Firm* — Sughrue Mion, PLLC

(57) ABSTRACT

A semiconductor package includes a wiring portion including an insulating layer, conductive patterns disposed on the insulating layer, and conductive vias penetrating through the insulating layer and connected to the conductive patterns, a semiconductor chip disposed on the wiring portion, an encapsulant disposed on the wiring portion and encapsulating at least a portion of the semiconductor chip, and a metal layer disposed on the semiconductor chip and the encapsulant and having a thickness of 10 μm to 70 μm.

9 Claims, 12 Drawing Sheets

(51) Int. Cl.
*H01L 23/538* (2006.01)
*H01L 23/00* (2006.01)
*H01L 23/31* (2006.01)
*H01L 21/48* (2006.01)
*H01L 21/683* (2006.01)
*H01L 21/56* (2006.01)
*H01L 23/36* (2006.01)

(52) U.S. Cl.
CPC ............ *H01L 21/56* (2013.01); *H01L 21/568* (2013.01); *H01L 21/6835* (2013.01); *H01L 23/3128* (2013.01); *H01L 23/3736* (2013.01); *H01L 23/49822* (2013.01); *H01L 23/49827* (2013.01); *H01L 23/5383* (2013.01); *H01L 23/5384* (2013.01); *H01L 23/36* (2013.01); *H01L 23/49816* (2013.01); *H01L 2221/68345* (2013.01); *H01L 2224/16225* (2013.01); *H01L 2224/73204* (2013.01)

(56) References Cited

U.S. PATENT DOCUMENTS

| | | | | |
|---|---|---|---|---|
| 9,171,825 | B2* | 10/2015 | Park | H01L 25/0657 |
| 9,620,413 | B2* | 4/2017 | Strothmann | H01L 23/28 |
| 9,653,443 | B2 | 5/2017 | Cheng et al. | |
| 2015/0380334 | A1* | 12/2015 | Hu | H01L 23/36 257/712 |
| 2016/0133538 | A1 | 5/2016 | Yu et al. | |
| 2017/0103951 | A1 | 4/2017 | Lee et al. | |
| 2017/0110413 | A1 | 4/2017 | Chen et al. | |
| 2017/0271272 | A1 | 9/2017 | Lee et al. | |

FOREIGN PATENT DOCUMENTS

| | | |
|---|---|---|
| KR | 10-2017-0107318 A | 9/2017 |
| TW | 201724387 A | 7/2017 |
| TW | 201724414 A | 7/2017 |
| WO | 2013/003695 A2 | 1/2013 |

OTHER PUBLICATIONS

Korean Office Action issued in corresponding Korean Patent Application No. 10-2017-0125284, dated May 11, 2018, with English Translation.

Taiwanese Office Action dated Nov. 27, 2018 issued in Taiwanese Patent Application No. 107110545 (with English translation).

* cited by examiner

FAN-OUT SEMICONDUCTOR PACKAGE

CROSS-REFERENCE TO RELATED APPLICATION(S)

This application claims benefit of priority to Korean Patent Application No. 10-2017-0125284 filed on Sep. 27, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of regions in which semiconductor chips are disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

In such a semiconductor package, when semiconductor chips, conductive patterns, an encapsulant, and the like are formed of different materials, a warpage problem, in which a package is bent upwardly or downwardly, according to a change in temperature, may occur.

SUMMARY

An aspect of the present disclosure may provide a fan-out semiconductor package in which room temperature warpage may be effectively controlled and heat radiation characteristics may be improved.

According to an aspect of the present disclosure, a semiconductor package may include a wiring portion including an insulating layer, conductive patterns disposed on the insulating layer, and conductive vias penetrating through the insulating layer and connected to the conductive patterns; a semiconductor chip disposed on the wiring portion; an encapsulant disposed on the wiring portion and encapsulating at least a portion of the semiconductor chip; and a metal layer disposed on the semiconductor chip and the encapsulant and having a thickness of 10 µm to 70 µm.

One surface of the semiconductor chip may be exposed from the encapsulant

The semiconductor chip may include an active surface on which connection pads are disposed, and an inactive surface opposite to the active surface, and the inactive surface may be exposed from the encapsulant.

The semiconductor package may further include an adhesive layer bonding the encapsulant and the semiconductor chip to the metal layer.

The metal layer may be a copper (Cu) foil.

The encapsulant and the semiconductor chip, and the metal layer may be directly in contact with each other.

The metal layer may be a copper (Cu) plating layer.

A plurality of semiconductor chips may be provided, and each of the plurality of semiconductor chips may have one surface exposed from the encapsulant.

The metal layer may be formed of the same material as the conductive patterns.

The thickness of the metal layer may be 30 µm to 50 µm.

The encapsulant may be made of a prepreg.

The insulating layer may be made of a photosensitive resin.

The semiconductor package may further include a passivation layer having openings exposing portions of the conductive patterns. At least one of the openings may be disposed in a fan-out region.

The metal layer may be electrically isolated from the conductive patterns and connection pads of the semiconductor chip.

The metal layer may extend across entire upper surfaces of the semiconductor chip and the encapsulant.

The metal layer may have a substantially uniform thickness.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

Electronic Device

Figure 1:
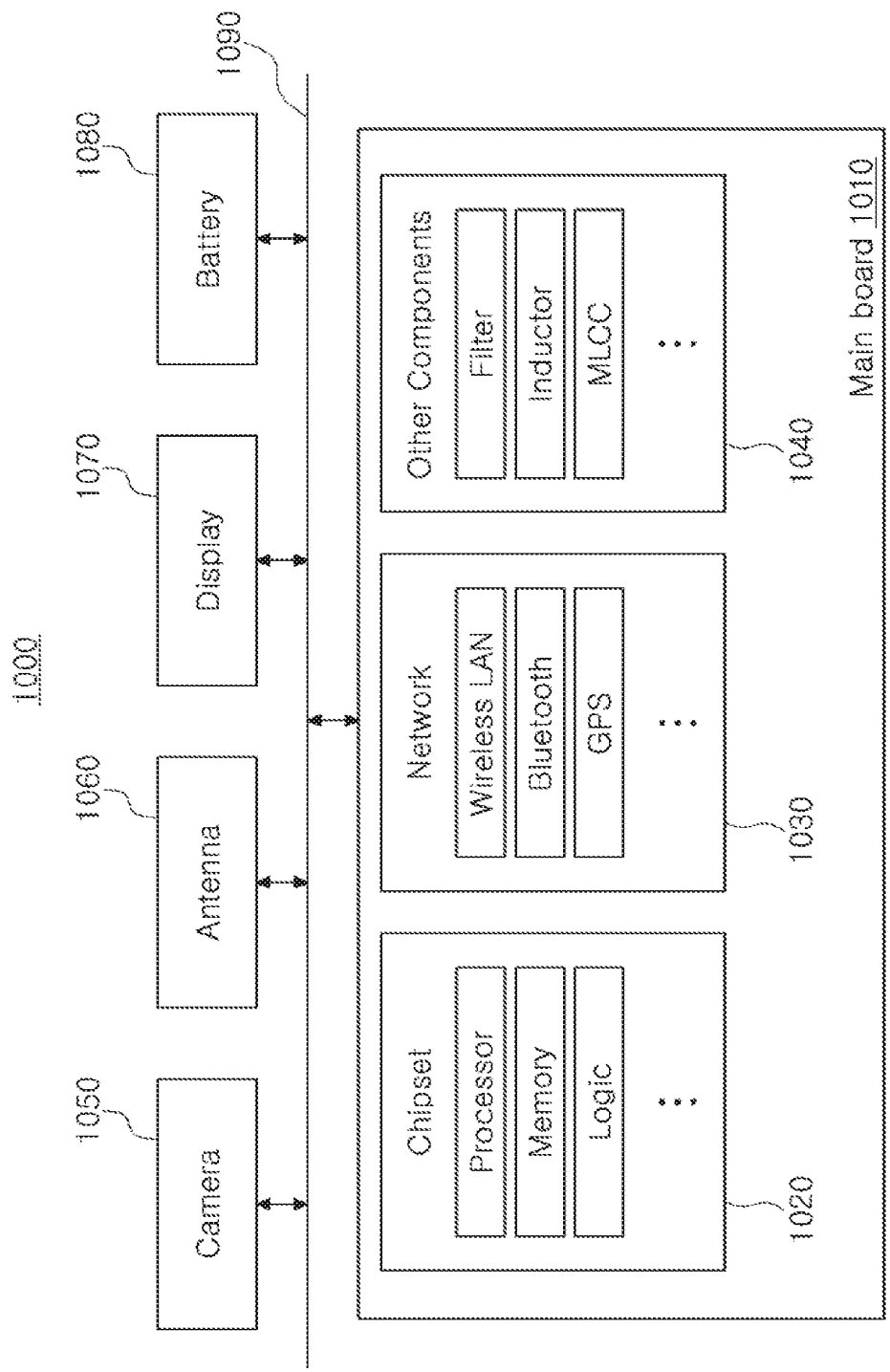
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip-related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
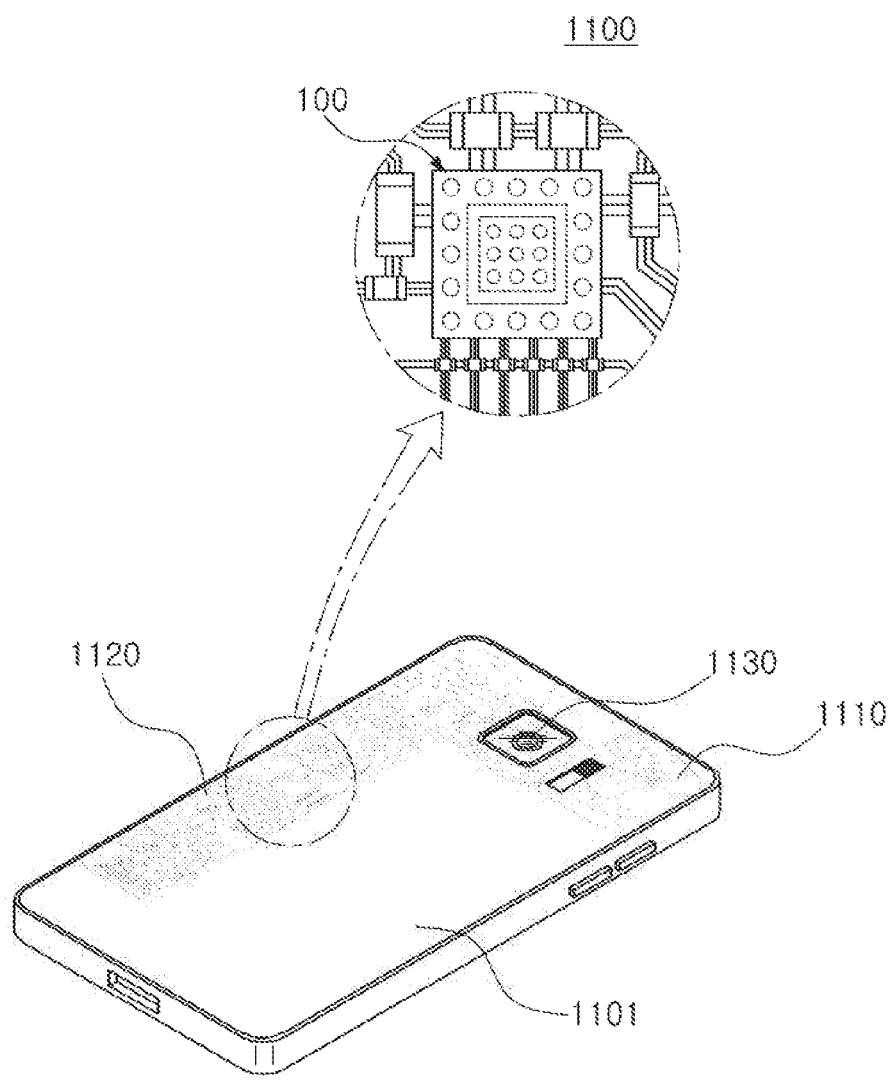
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various components 1120 may be physically or electrically connected to the motherboard 1110. In addition, other components that may or may not be physically or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required, due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
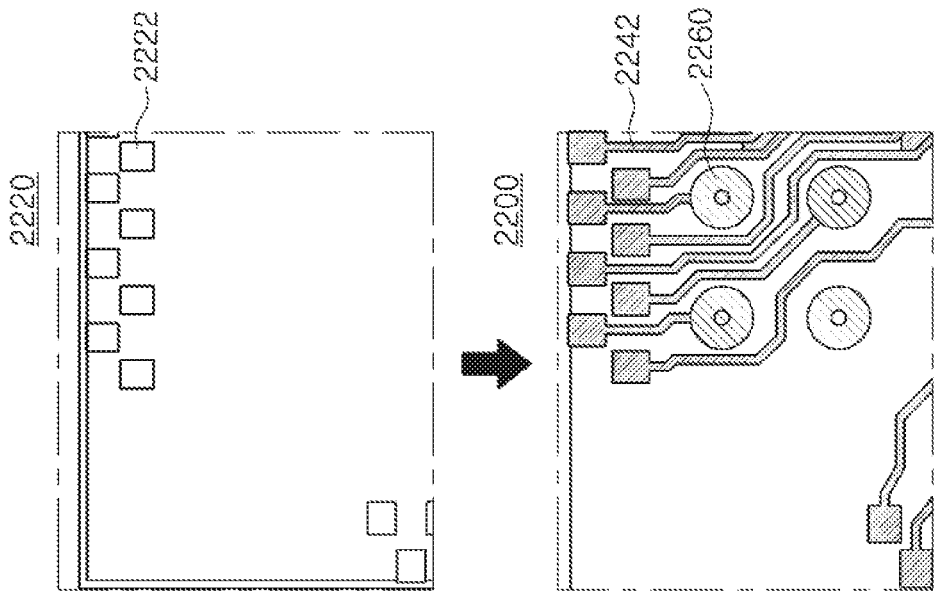
FIGS. 3A and 3B are schematic cross-sectional views illustrating states of a fan-in semiconductor package before and after being packaged.
Figure 3A:
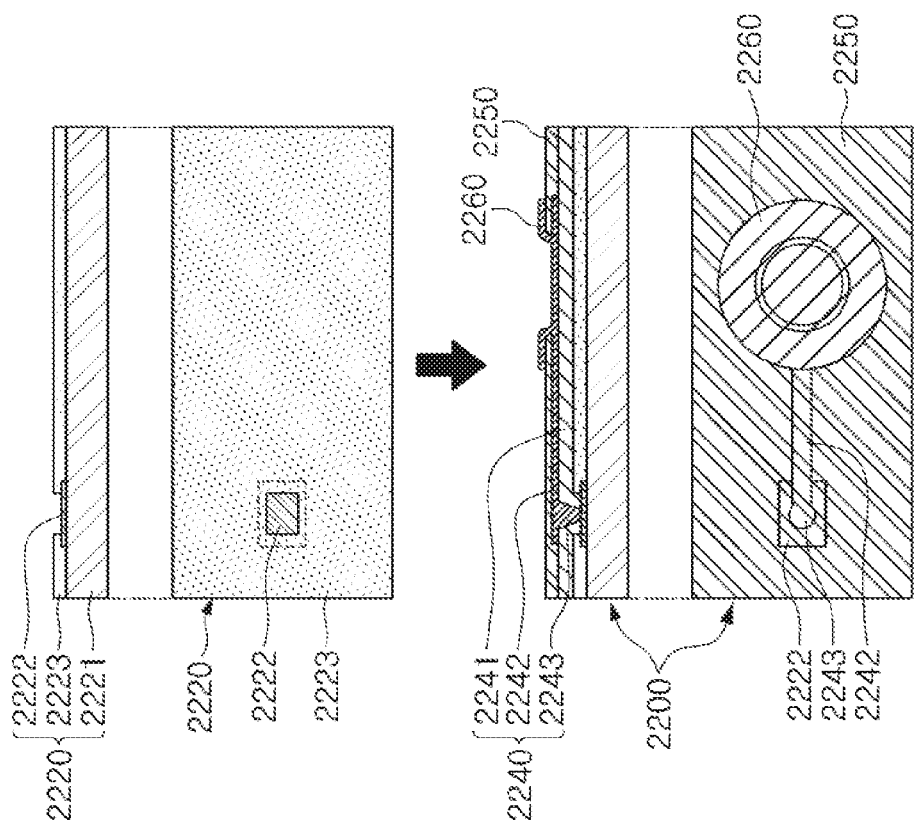

FIGS. 3A and 3B are schematic cross-sectional views illustrating states of a fan-in semiconductor package before and after being packaged.

Figure 4:
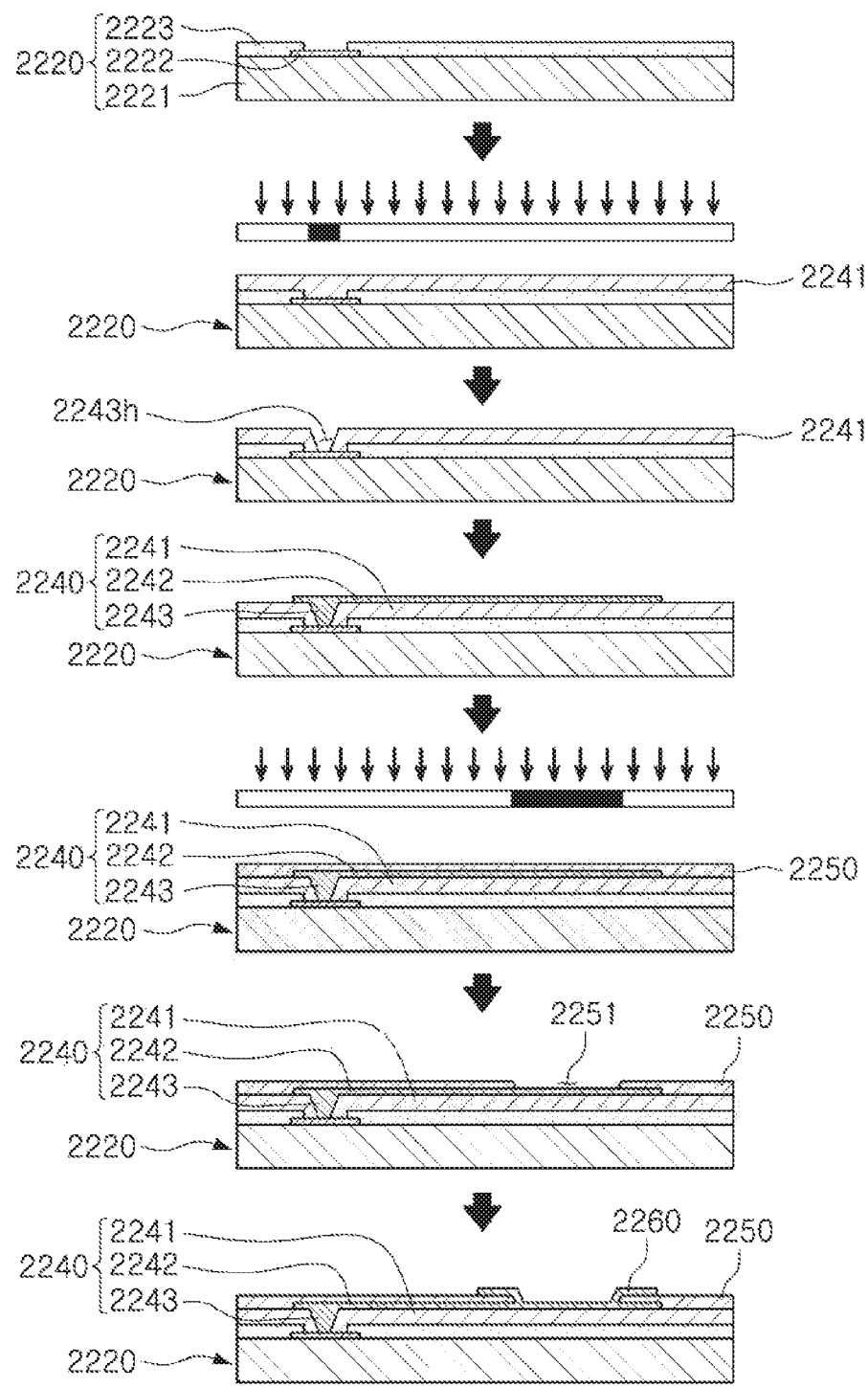
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
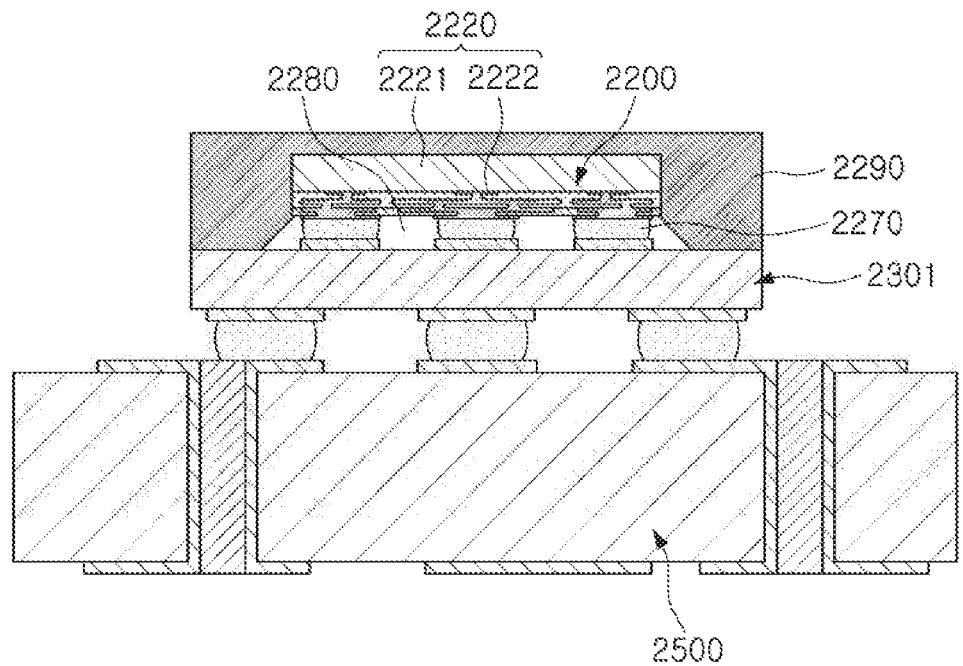
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
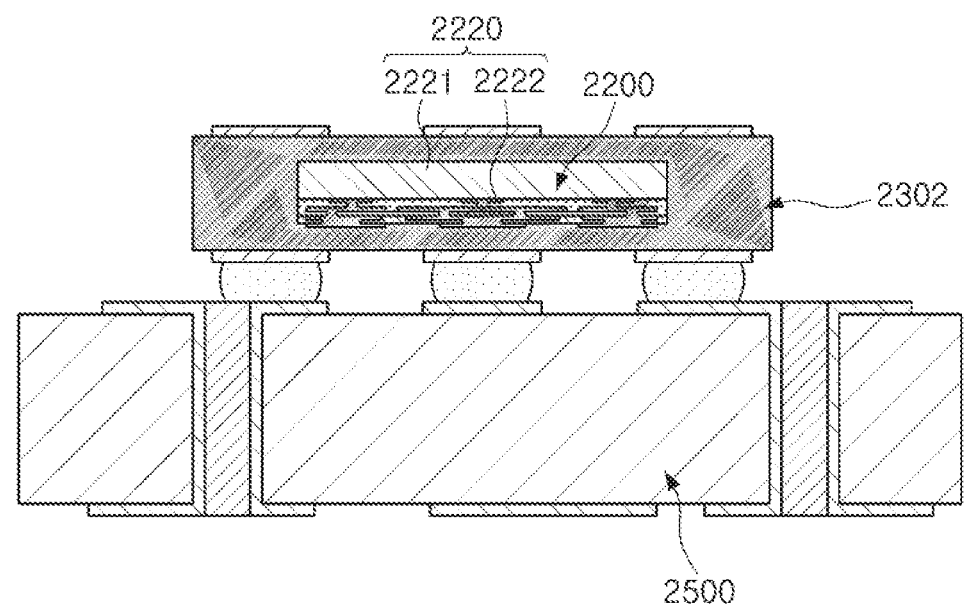
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
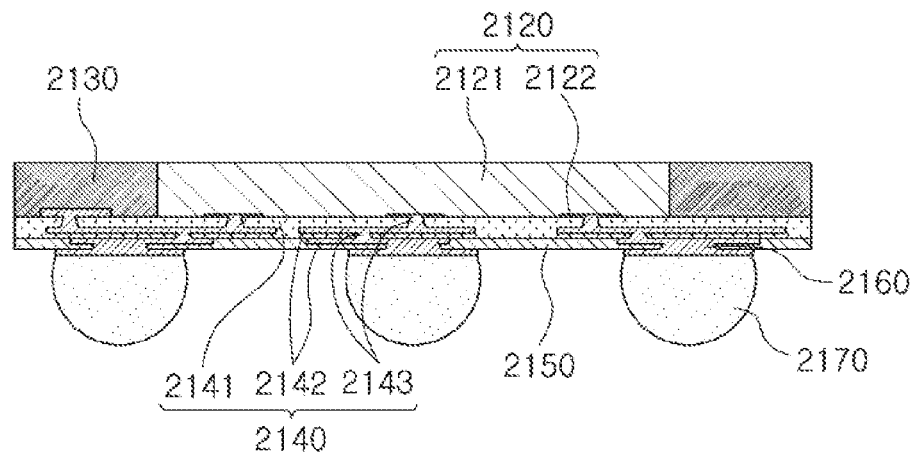
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may further be formed on the connection member 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
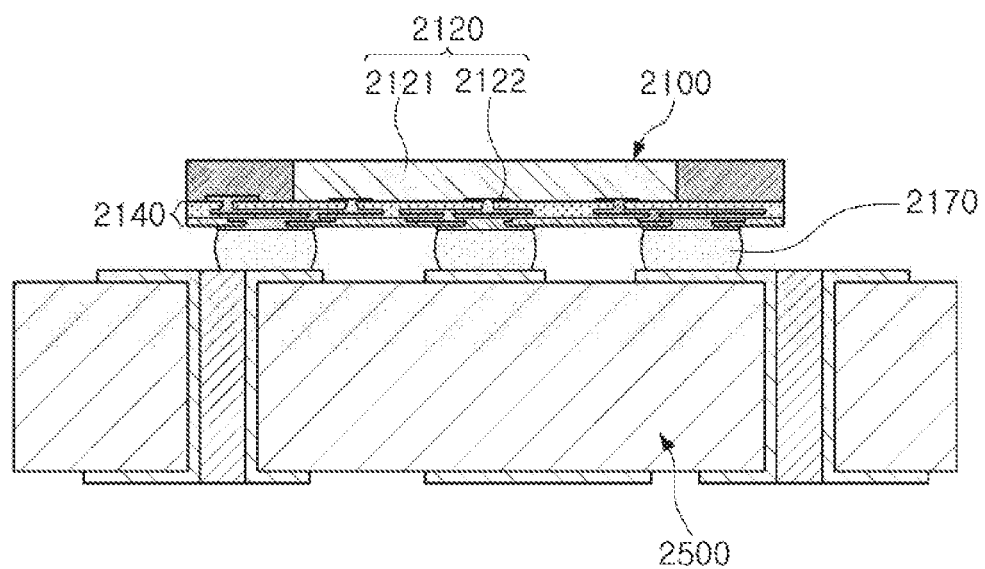
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package containing a metal layer capable of effectively reducing warpage that may occur due to a difference in thermal expansion characteristics of an upper portion and a lower portion of a semiconductor package based on a center line of the semiconductor package will hereinafter be described with reference to the drawings.

Figure 9:
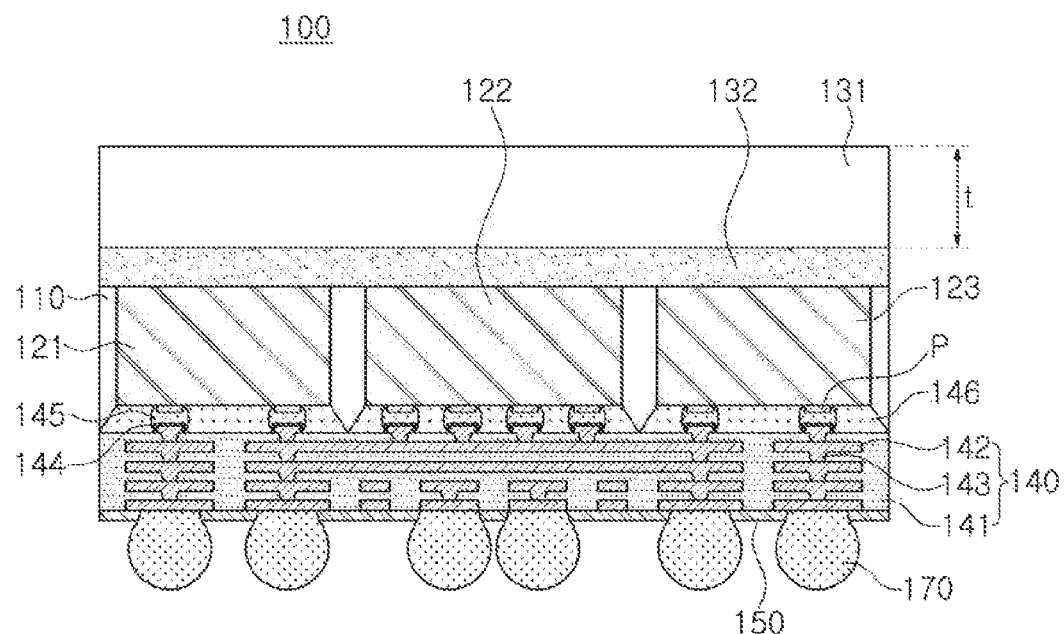
FIG. 9 is a schematic cross-sectional view illustrating an example of a fan-out semiconductor package.
Figure 10:
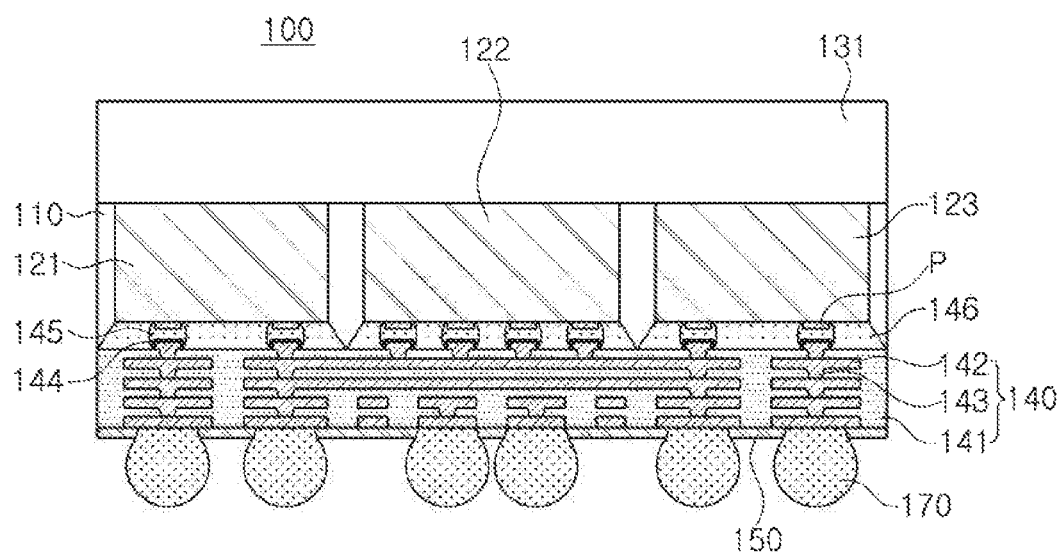
FIG. 10 is a schematic cross-sectional view illustrating a fan-out semiconductor package according to an example modified from a structure of FIG. 9.

FIG. 9 is a schematic cross-sectional view illustrating an example of a fan-out semiconductor package. FIG. 10 is a schematic cross-sectional view illustrating a fan-out semiconductor package according to an example modified from a structure of FIG. 9.

Referring to FIGS. 9 and 10, a fan-out semiconductor package 100 according to an exemplary embodiment may include a wiring portion 140, semiconductor chips 121, 122, and 123 disposed on the wiring portion 140, an encapsulant 110 disposed on the wiring portion 140 and encapsulating at least a portion of the semiconductor chips 121, 122, and 123, and a warpage reducing metal layer 131 disposed on the semiconductor chips 121, 122, and 123 and the encapsulant 110. Here, a thickness t1 of the metal layer 131 may have the range of 10 μm to 70 μm so as to be suitable for reducing room temperature warpage. In addition to the components described above, the fan-out semiconductor package 100 may include a passivation layer 150 covering at least a portion of the wiring portion 140, and electrical connection structures 170 connected with the conductive patterns 142 as illustrated in FIG. 9.

The respective components included in the fan-out semiconductor package 100 according to the exemplary embodiment will hereinafter be described in more detail.

The semiconductor chips 121, 122, and 123 may have active surfaces on which connection pads P are disposed, and inactive surfaces disposed opposite to the active surfaces. Although the present exemplary embodiment describes the fan-out semiconductor package 100 including three semiconductor chips 121, 122, and 123, the number of the semiconductor chips 121, 122, and 123 may be changed to one, two, or greater than three, if necessary. The semiconductor chips 121, 122, and 123 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and provided.

The semiconductor chips 121, 122, and 123 may be formed on the basis of an active wafer. In this case, a base material of each of bodies of the semiconductor chips 121, 122, and 123 may be silicon (Si), germanium (Ge), gallium arsenide (GaAs), or the like. In addition, various circuits may be formed on the body. The connection pads P may electrically connect the semiconductor chips 121, 122, and 123 to other components. A material of each of the connection pads P may be a conductive material such as aluminum (Al), or the like. In this case, plating layers 144 may be formed on surfaces of the connection pads P.

Adhesive electrical connection parts 145 such as conductive pillars, solders, or the like may be interposed between the connection pads P and the plating layers 144. In addition, a bonding part 146 formed of an insulating adhesive layer, or the like may be interposed between the semiconductor chips 121, 122, and 123 and the wiring portion 140 to stably mount the semiconductor chips 121, 122, and 123. However, such a bonding part 146 may be appropriately modified or omitted according to an exemplary embodiment. The bonding part 146 may be a solder resist formed to expose the connection pads P of the semiconductor chips 121, 122, and 123. Meanwhile, the semiconductor chips 121, 122, and 123 may be a bare die, a redistribution layer (not illustrated) may further be formed on the active surfaces of the semiconductor chips 121, 122, and 123, if necessary, and bumps (not illustrated), or the like, may be connected to the connection pads P.

The encapsulant 110 may protect the semiconductor chips 121, 122, and 123, the wiring portion 140, and the like. An encapsulation form of the encapsulant 110 is not particularly limited, and may be a form in which the encapsulant 110 surrounds at least portions of the semiconductor chips 121, 122, and 123 and the wiring portion 140. According to the present exemplary embodiment, one surface of each of the semiconductor chips 121, 122, and 123 may be exposed from the encapsulant 110. Accordingly, heat generated in the semiconductor chips 121, 122, and 123 may be effectively discharged. In more detail, the inactive surfaces (corresponding to the top surface in FIG. 9) of the semiconductor chips 121, 122, and 123 may be exposed from the encapsulant 110, as illustrated in FIG. 9. Although the present exemplary embodiment illustrates the form in which one surface of each of all of the semiconductor chips 121, 122, and 123 is exposed, only some of one surface of each of the semiconductor chips 121, 122, and 123 may also be exposed.

A material of the encapsulant 110 is not particularly limited. For example, an insulating material may be used as the material of the encapsulant 110. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a photo imagable encapsulant (PIE) resin may also be used as the insulating material.

The wiring portion 140 may redistribute the connection pads P of the semiconductor chips 121, 122, and 123. Several tens to several hundreds of connection pads P of the semiconductor chips 121, 122, and 123 having various functions may be redistributed by the wiring portion 140, and may be physically or electrically externally connected through the electrical connection structures 170 depending on the functions. The wiring portion 140 may include the insulating layers 141, the conductive patterns 142, and the conductive vias 143.

An insulating material of each of the insulating layers 141 may be various kinds of materials, for example, a photosensitive resin. In a case in which the insulating layers 141 have photosensitivity, the insulating layers 141 may be formed to be thinner. Further, the conductive vias 143 may be implemented in finer pitch. In order to adjust rigidity or other properties, the insulating layers 141 may include an inorganic filler. When the insulating layers 141 are multiple layers, materials of the insulating layers 141 may be the same as each other, and may also be different from each other, if necessary. In addition, when the insulating layers 141 are the multiple layers, the insulating layers 141 may be integrated with each other depending on a process, such that a boundary therebetween may also not be apparent.

The conductive patterns 142 may serve to substantially redistribute the connection pads P. A material of each of the conductive patterns 142 may be a conductive material such as copper (Cu), aluminum (Al), silver (Ag), tin (Sn), gold (Au), nickel (Ni), lead (Pb), titanium (Ti), or alloys thereof. The conductive patterns 142 may perform various functions depending on a design of the corresponding layers. For example, the conductive patterns 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the conductive patterns 142 may include via pad patterns, electrical connection structure pad patterns, and the like. A thickness of each of the conductive patterns 142 may be about 0.5 μm to 15 μm.

The conductive vias 143 may electrically connect the conductive patterns 142, the connection pads P, and the like, formed on different layers to each other, thereby forming an electrical path within the fan-out semiconductor package 100. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have any shape known in the related art, such as a tapered shape, a cylindrical shape, and the like.

The passivation layer 150 may protect the wiring portion 140 from external physical or chemical damage. The passivation layer 150 may have openings exposing at least portions of the conductive patterns 142 of the wiring portion 140. The number of openings formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The electrical connection structures 170 may physically or electrically externally connect the fan-out semiconductor package 100. For example, the fan-out semiconductor package 100 may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, and may be sufficiently modified depending on design particulars by those skilled in the art. For example, the electrical connection structures 170 may be provided in an amount of several tens to several thousands according to the number of connection pads P, or may be provided in an amount of several tens to several thousands or more or several tens to several thousands or less. When the electrical connection structures 170 are solder balls, the electrical connection structures 170 may cover side surfaces of the openings in the passivation layer 150 and extend onto one surface of the passivation layer 150, and connection reliability may be more excellent.

At least one of the electrical connection structures 170 may be disposed in a fan-out region. The fan-out region is a region except for a region in which the semiconductor chips 121, 122, and 123 are disposed. The fan-out package may have greater reliability than that of a fan-in package, may implement a plurality of I/O terminals, and may easily perform 3D interconnection. In addition, as compared to a ball grid array (BGA) package, a land grid array (LGA) package, or the like, the fan-out package may be manufactured to have a small thickness, and may have price competitiveness.

According to the present exemplary embodiment, the metal layer 131 having a thickness of 10 μm to 70 μm may be disposed on the semiconductor chips 121, 122, and 123 and the encapsulant 110, such that the room temperature warpage is reduced.

In a form in which the encapsulant 110 covers upper portions of the semiconductor chips 121, 122, and 123 according to one example (not shown), the warpage may be adjusted by adjusting a thickness of a portion of the encapsulant 110 covering the upper portions of the semiconductor chips 121, 122, and 123. Because the semiconductor chips 121, 122, and 123 are covered by the encapsulant 110 having a relatively lower thermal conductivity, heat generated by the semiconductor chips 121, 122, and 123 may not efficiently dissipated, as compared to the examples shown in FIGS. 9 and 10 which include the metal layer 131 or a combined structure including the adhesive layer 132 and the metal layer 131, or as compared to an example to be described below in which the upper portions of the semiconductor chips 121, 122, and 123 are exposed externally.

In a structure in which the top surfaces of the semiconductor chips 121, 122, and 123 are externally exposed according to another example (not shown), the warpage may occur due to different thermal expansion characteristics of an upper portion and a lower portion of a fan-out semiconductor package based on a center line of the fan-out semiconductor package. Since an effective thermal expansion coefficient of the lower portion of the fan-out semiconductor package by considering a ratio of a material having a relatively lower thermal expansion coefficient such as the conductive patterns 142, or the like in the lower portion of the fan-out semiconductor package and a material having a relatively higher thermal explanation coefficient such as the insulating layers 141, or the like in the lower portion of the fan-out semiconductor package, may be greater than that of the upper portion which substantially includes a semiconductor material such as silicon, or the like of the semiconductor chips 121, 122, and 123, the warpage may occur in a process of manufacturing the fan-out semiconductor package or when a temperature is changed according to this example. For example, when the temperature is changed from a high temperature to room temperature, an amount of shrinkage of the lower portion of the fan-out semiconductor package may be increased such that a warpage of an upwardly convex form may occur.

On the other hand, the metal layer 131 disposed on the upper portion of the fan-out semiconductor package 100 may allow thermal expansion characteristics of the upper portion of the fan-out semiconductor package 100 to be similar to those of the lower portion of the fan-out semiconductor package 100, thereby improving warpage characteristics of the fan-out semiconductor package 100. To this end, the metal layer 131 may be formed of the same material as the conductive patterns 142. As an example, the metal layer 131 may be provided a form of copper (Cu) foil, and in order to secure structural stability, an adhesive layer 132 bonding between the encapsulant 110 and the semiconductor chips 121, 122, and 123, and the metal layer 131 may be interposed between the encapsulant 110 and the semiconductor chips 121, 122, and 123, and the metal layer 131. Unlike this, as illustrated in the modified example of FIG. 10, the encapsulant 110 and the semiconductor chips 121, 122, and 123, and the metal layer 131 may be directly in contact with each other without having the adhesive layer interposed therebetween. As a result, heat radiation characteristics may be further improved. In order to implement such a direct contact structure, the metal layer 131 may be formed by a plating process, and may be, for example, a Cu plating layer. The metal layer 131 may be electrically isolated from the conductive patterns 142 and the connection pads P of the semiconductor chips 121, 122, and 123. The metal layer 131 may extend across the entire inactive surfaces of the semiconductor chips 121, 122, and 123 and the entire upper surface of the encapsulant 110. The metal layer 131 may have a uniform thickness, or a substantially uniform thickness in a case in which process tolerance/variations/errors are considered.

Figure 11:
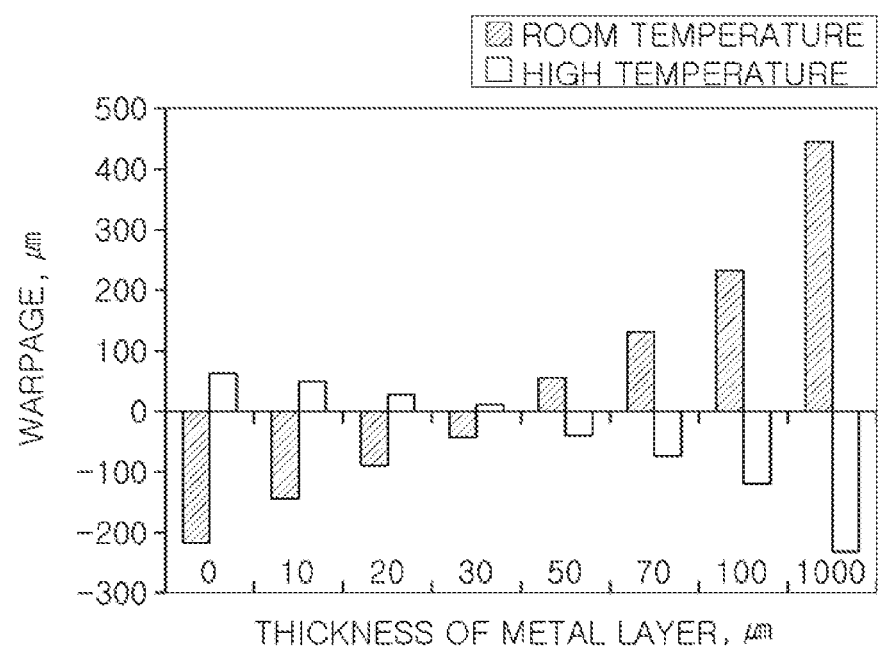
FIG. 11 is a graph illustrating warpage characteristics according to a thickness of a metal layer.

Meanwhile, the inventors have found that when the thickness of the metal layer 131 is appropriately controlled, it is advantageous in terms of warpage characteristics and when the thickness of the metal layer 131 exceeds a specific range, it is advantageous in heat radiation characteristics but warpage characteristics are significantly deteriorated. A description thereof will be provided with reference to a graph of FIG. 11 illustrating warpage characteristics depending on the thickness of the metal layer 131. In the graph, a negative value (−) corresponds to an upwardly convex warpage and a positive value (+) corresponds to a downwardly convex warpage. According to the result, it may be seen that the room temperature warpage is reduced in the range in which the thickness of the metal layer is 10 μm to 70 μm. Here, a total thickness of the fan-out semiconductor package used in an experiment is about 860 μm except or solder bumps (corresponding to the electrical connection structures 170).

In addition, when the thickness of the metal layer is less than 10 μm, warpage reduction performance is low, and when the thickness of the metal layer exceeds 70 μm, warpage of opposite tendency significantly occurs. The reason is because the thermal expansion coefficient of the upper portion of the fan-out semiconductor package is excessively increased as the metal layer is excessively thickened. According to the above-mentioned results, it may be seen that the warpage is effectively controlled when the thickness of the metal layer 131 is 10 μm to 70 μm, and more preferably, the range of the thickness of the metal layer 131 may be 30 μm to 50 μm.

One example of a method for manufacturing a fan-out semiconductor package having the above-mentioned structure will hereinafter be described, and structural characteristics of the fan-out semiconductor package may be more clearly understood from a description of a manufacturing process. FIGS. 12 through 19 are cross-sectional views schematically illustrating a process of manufacturing a fan-out semiconductor package according to an exemplary embodiment in the present disclosure.

Figure 12:
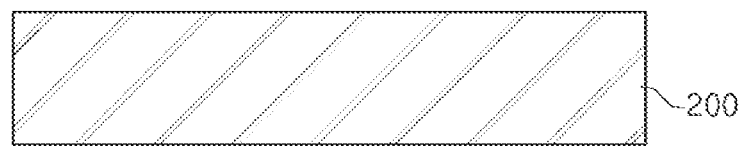
FIGS. 12 through 19 are cross-sectional views schematically illustrating a process of manufacturing a fan-out semiconductor package according to an exemplary embodiment in the present disclosure.
Figure 13:
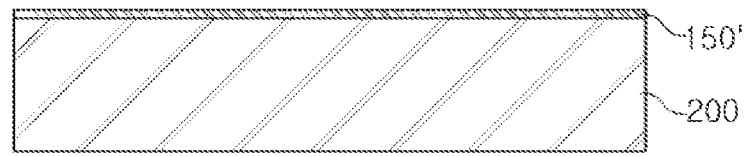

First, as illustrated in FIGS. 12 and 13, a carrier 200 may be prepared and a passivation layer 150' may be then formed on the carrier 200. The carrier 200 may handle a wiring portion 140 having a relatively thin thickness, and a material of the carrier 200 is not particularly limited as long as the carrier 200 serves as a support. The carrier 200 may have a multilayer structure, and may include a release layer, a metal layer, and the like, so as to be easily removed from the wiring portion 140 in a subsequent process. For example, the carrier 200 may be a copper clad laminate (CCL). The passivation layer 150' may be formed of a material such as an epoxy, a polyimide resin, or the like using an application process known in the related art.

Figure 14:
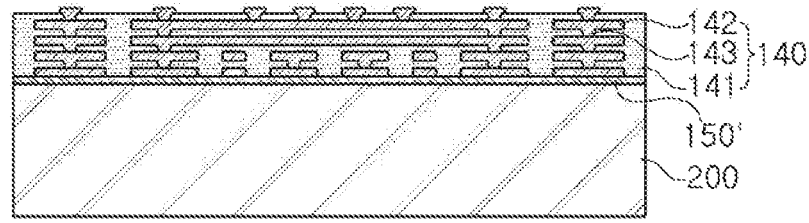
Figure 15:
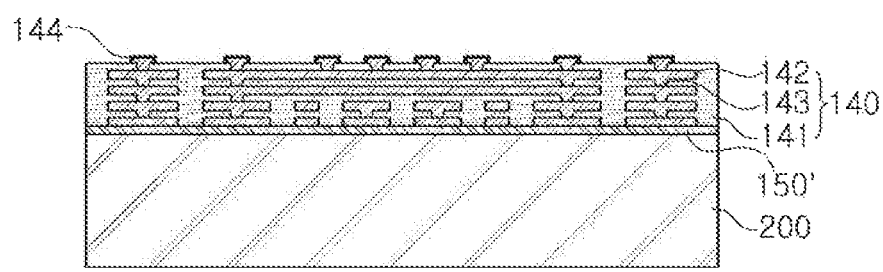

Next, as illustrated in FIG. 14, the wiring portion 140 may be formed on the carrier 200 and a plating layer 144 may be then formed to cover conductive patterns 142 as illustrated in FIG. 15. In order to implement the wiring portion 140, the insulating layer 141, the conductive patterns 142, and the conductive vias 143 may be formed depending on intended shapes, and a process of forming the insulating layer 141, the conductive patterns 142, and the conductive vias 143 may be repeated by the required number of times. In this case, the plating layer 144 may further be formed on the conductive patterns 142 at the uppermost portion. The plating layer 144 may cover upper surfaces and side surfaces of the upper most conductive patterns 142. The insulating layer 141 may be formed by the known method, for example, a method of laminating the insulating layer 141 and then hardening the insulating layer 141, a method of applying a material for forming the insulating layer 141 and then hardening the material, or the like. As the method of laminating the insulating layer, for example, a method of performing a hot press process of pressing the insulating layer for a predetermined time at a high temperature, decompressing the insulating layer, and then cooling the insulating layer to room temperature, cooling the insulating layer in a cold press process, and then separating a work tool, or the like, may be used. As a method of applying a material, for example, a screen printing method of applying ink with a squeegee, a spray printing method of applying ink in a mist form, or the like, may be used. The hardening process, which is a post-process, may be a process of drying the material so as not to be completely hardened in order to use a photolithography method, or the like.

An electrical test for determining whether or not the wiring portion 140 is bad may be performed before mounting the semiconductor chips. In detail, it is checked whether the wiring portion 140 is bad in terms of an electrical connection, and as one example of such a method, a test jig may be connected to the conductive patterns 142 on the wiring portion 140. Whether or not the wiring portion 140 is bad may be checked in advance by such an electrical test, thereby significantly reducing unnecessary consumption of the electronic components. That is, the wiring portion 140 determined to be bad in the present test process may be discarded or reused for another purpose, and a subsequent process is not performed on the wiring portion 110 determined to be bad, such that a process cost may be reduced. Such a wiring portion 140 may include an additional structure for electrical test such as a daisy chain, and accordingly, the electrical test may be performed through an upper portion of the wiring portion 140 even in a state in which the carrier 200 is bonded to the lower portion of the wiring portion 140.

Figure 16:
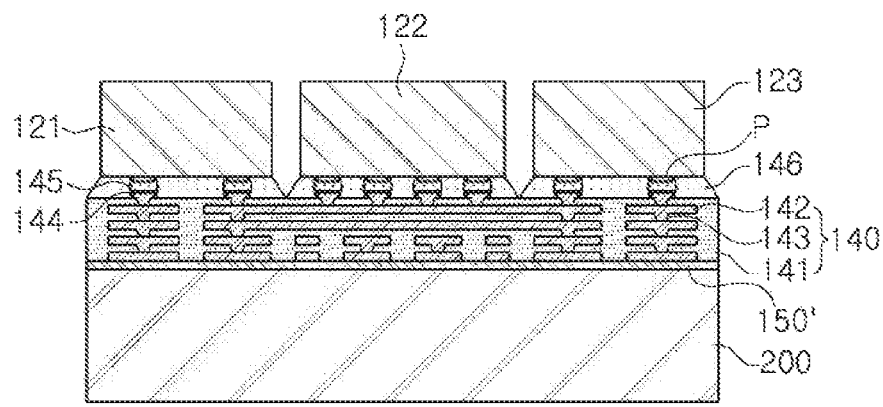

Next, as illustrated in FIG. 16, the semiconductor chips 121, 122, and 123, may be disposed and mounted on the wiring portion 140, and in this case, the semiconductor chips 121, 122, and 123 may be disposed so that the electrode pads P are directed to the wiring portion 140. In order to stably mount the semiconductor chips 121, 122, and 123, a bonding part 144, or the like may be formed on the wiring portion 140 before mounting the semiconductor chips 121, 122, and 123 on the wiring portion 140.

Figure 17:
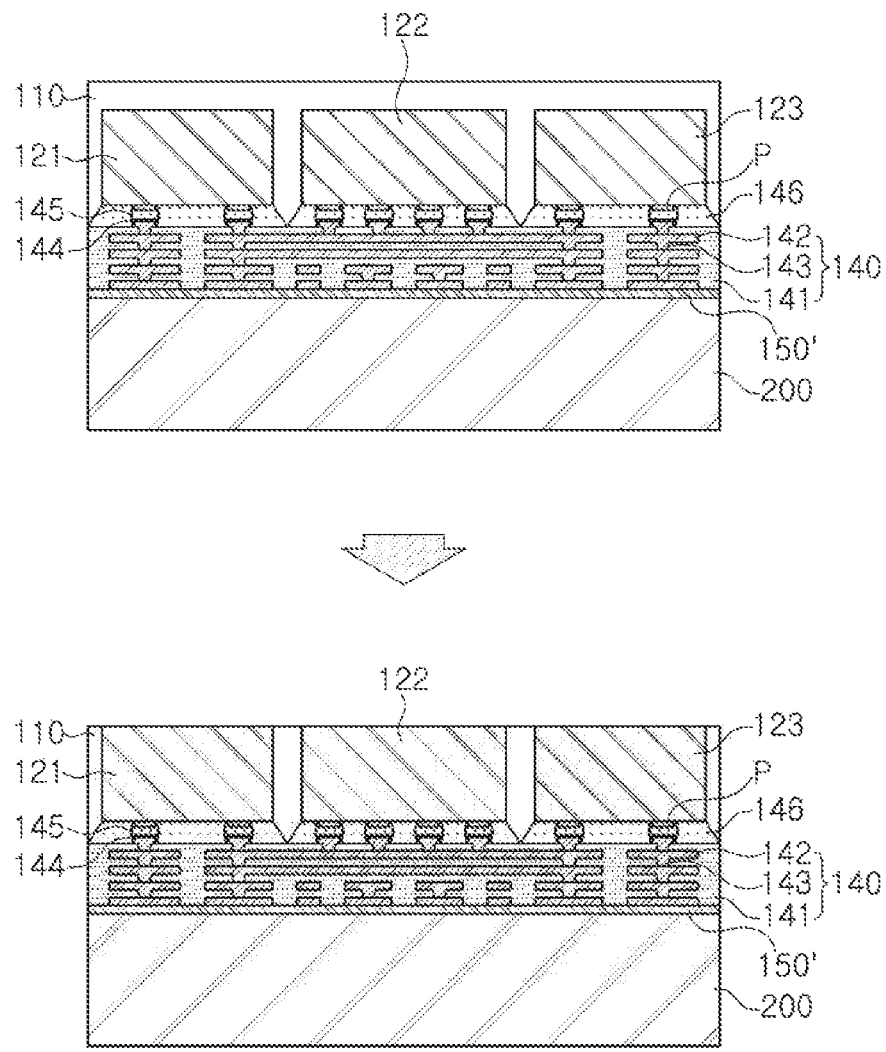

Next, as illustrated in FIG. 17, an encapsulant 110 covering the semiconductor chips 121, 122, and 123 may be formed. A method for forming an encapsulant 110 may be a method for stacking a resin film such as ABF, or the like in an unhardened state on the wiring portion 140 and then hardening the resin film. In this case, the encapsulant 110 may be over-molded to cover upper surfaces of the semiconductor chips 121, 122, and 123 and may be then removed by an appropriate polishing process. As a result, the upper surfaces of the semiconductor chips 121, 122, and 123 may be exposed. In addition, the upper surfaces of the semiconductor chips 121, 122, and 123 may be partially removed in such a polishing process. In this case, the upper surfaces of the semiconductor chips 121, 122, and 123 and the upper surface of the encapsulant may be coplanar with each other.

Figure 18:
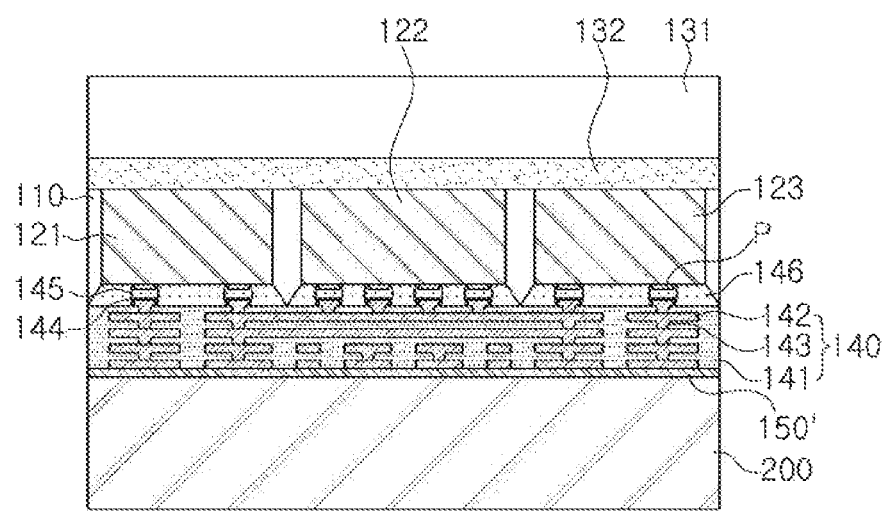

Next, as illustrated in FIG. 18, a metal layer 131 may be disposed on the semiconductor chips 121, 122, and 123. For example, the metal layer 131 may be attached to the upper surfaces of the semiconductor chips 121, 122, and 123 using an adhesive layer 132. Unlike this, the metal layer 131 may be directly in contact with the semiconductor chips 121, 122, and 123 without using the adhesive layer 132, thereby improving heat radiation performance.

Figure 19:
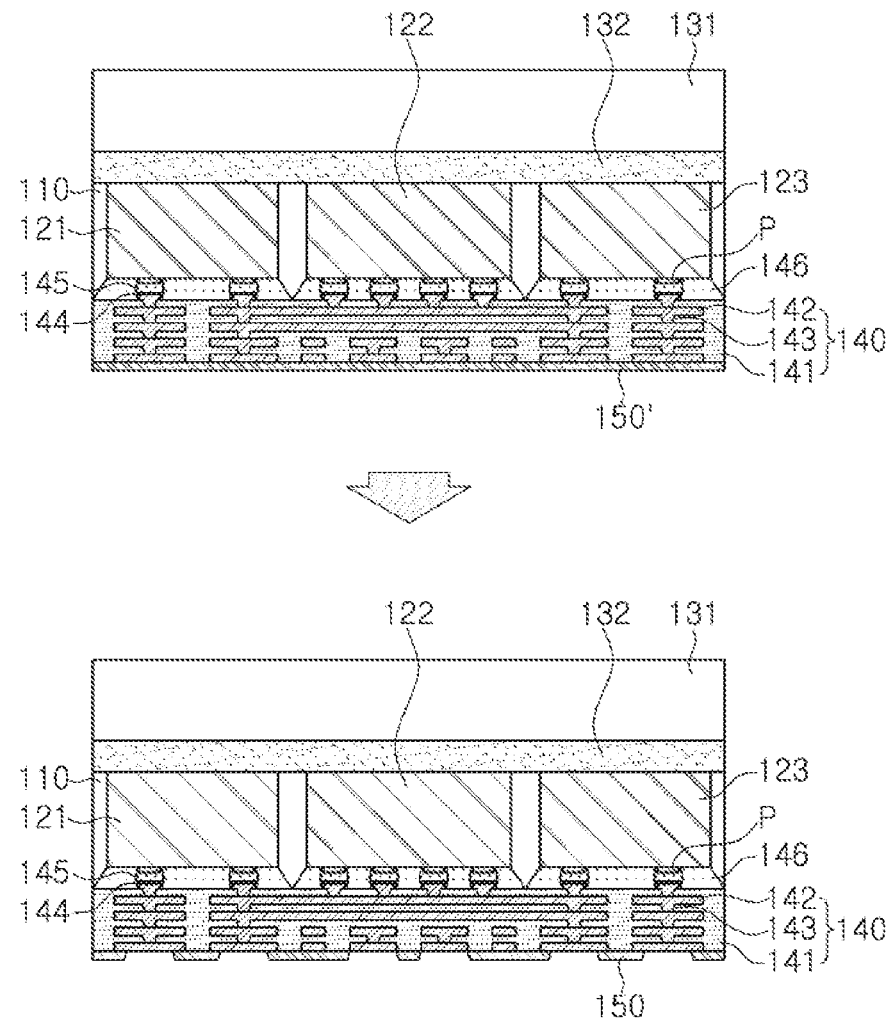

Next, the carrier 200 may be removed from the wiring portion 140, and FIG. 19 illustrates a state after the carrier 200 is removed from the wiring portion 140. Materials remaining after removing the carrier 200 may be removed by appropriately using an etching and desmearing process used in the related art. When the carrier 200 is removed, warpage may occur due to a difference in thermal expansion coefficients of the upper and lower portions of the fan-out semiconductor package. However, the occurrence of warpage may be reduced by the metal layer 131 having an optimized thickness range as described above. Next, the conductive patterns 142 may be exposed by removing a portion of the passivation layer 150'. As a result, the fan-out semiconductor package as illustrated in FIG. 9 may be implemented.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the fan-out semiconductor package in which the room temperature warpage is effectively controlled may be provided. Further, the heat radiation characteristics may be improved by adopting the metal layer for controlling the room temperature warpage.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a wiring portion including an insulating layer, conductive patterns disposed on the insulating layer, and conductive vias penetrating through the insulating layer and connected to the conductive patterns;
   a plurality of semiconductor chips disposed on the wiring portion and including an active surface on which connection pads are disposed, and an inactive surface opposite to the active surface;
   an encapsulant disposed on the wiring portion and encapsulating at least a portion of the plurality of the semiconductor chips; and
   a metal layer disposed on the plurality of the semiconductor chips and the encapsulant and having a thickness of 10 μm to 70 μm,
   wherein each of the inactive surfaces of the plurality of semiconductor chips is exposed from the encapsulant,
   each of the inactive surfaces of the plurality of semiconductor chips is coplanar with an upper surface of the encapsulant,
   the metal layer has an integrated structure covering each of the inactive surfaces of the plurality of semiconductor chips,
   the metal layer is in direct contact with the upper surface of the encapsulant and each of the inactive surfaces of the plurality of semiconductor chips without having an adhesive layer interposed therebetween, and
   the metal layer is a copper (Cu) plating layer.

2. The semiconductor package of claim 1, wherein the metal layer is made of the same material as the conductive patterns.

3. The semiconductor package of claim 1, wherein the thickness of the metal layer is 30 μm to 50 μm.

4. The semiconductor package of claim 1, wherein the encapsulant is made of a prepreg.

5. The semiconductor package of claim 1, wherein the insulating layer is made of a photosensitive resin.

6. The semiconductor package of claim 1, further comprising a passivation layer having openings exposing portions of the conductive patterns,
   wherein at least one of the openings is disposed in a fan-out region.

7. The semiconductor package of claim 1, wherein the metal layer is electrically isolated from the conductive patterns and connection pads of the semiconductor chips.

8. The semiconductor package of claim 1, wherein the metal layer extends across entire upper surfaces of the semiconductor chips and the encapsulant.

9. The semiconductor package of claim 1, wherein the metal layer has a substantially uniform thickness.

* * * * *